United States Patent [19]

Garrett

[11] Patent Number: 4,588,343

[45] Date of Patent: May 13, 1986

[54] WORKPIECE LIFTING AND HOLDING APPARATUS

[75] Inventor: Charles B. Garrett, San Jose, Calif.

[73] Assignee: Varian Associates, Inc., Palo Alto, Calif.

[21] Appl. No.: 762,606

[22] Filed: Aug. 5, 1985

Related U.S. Application Data

[62] Division of Ser. No. 611,762, May 18, 1984, abandoned.

[51] Int. Cl.[4] ................................................ H01J 5/02
[52] U.S. Cl. ..................................... 414/221; 414/222
[58] Field of Search ............... 414/217, 222, 287, 292, 414/331, 416, 221; 118/50, 728, 729, 500; 198/773, 775

[56] References Cited

U.S. PATENT DOCUMENTS 3,973,665  8/1976  Giammanco ............... 414/217 X
4,388,034  6/1983  Takahashi .................. 414/217 X Primary Examiner—Robert G. Sheridan
Attorney, Agent, or Firm—Stanley Z. Cole; Kenneth L. Warsh

[57] ABSTRACT

An automatic sputtering apparatus for coating semiconductor wafers uses shuttle wafer carriers and elevators to handle wafers within the apparatus. The wafer carrier has a hole in the center. One side of the wafer carrier is opened, thereby forming a throat in the shuttle wafer carrier in the form of the letter C. The elevator has a cantilevered shaft. The upper part of the shaft of the elevator is centered under the wafer while the lowest part of the cantilevered shaft is under a point outside the wafer carrier. The connecting portion of the shaft passes through the throat of the wafer carrier as the wafer is lifted. Since the lifting portion of the shaft is outside the wafer carrier, the shuttle can move with the elevator in the up position. The pedestal for holding the wafer on the elevator is equipped with arms which project upward at an angle to the horizontal, thereby confining the wafer to a pedestal.

14 Claims, 8 Drawing Figures

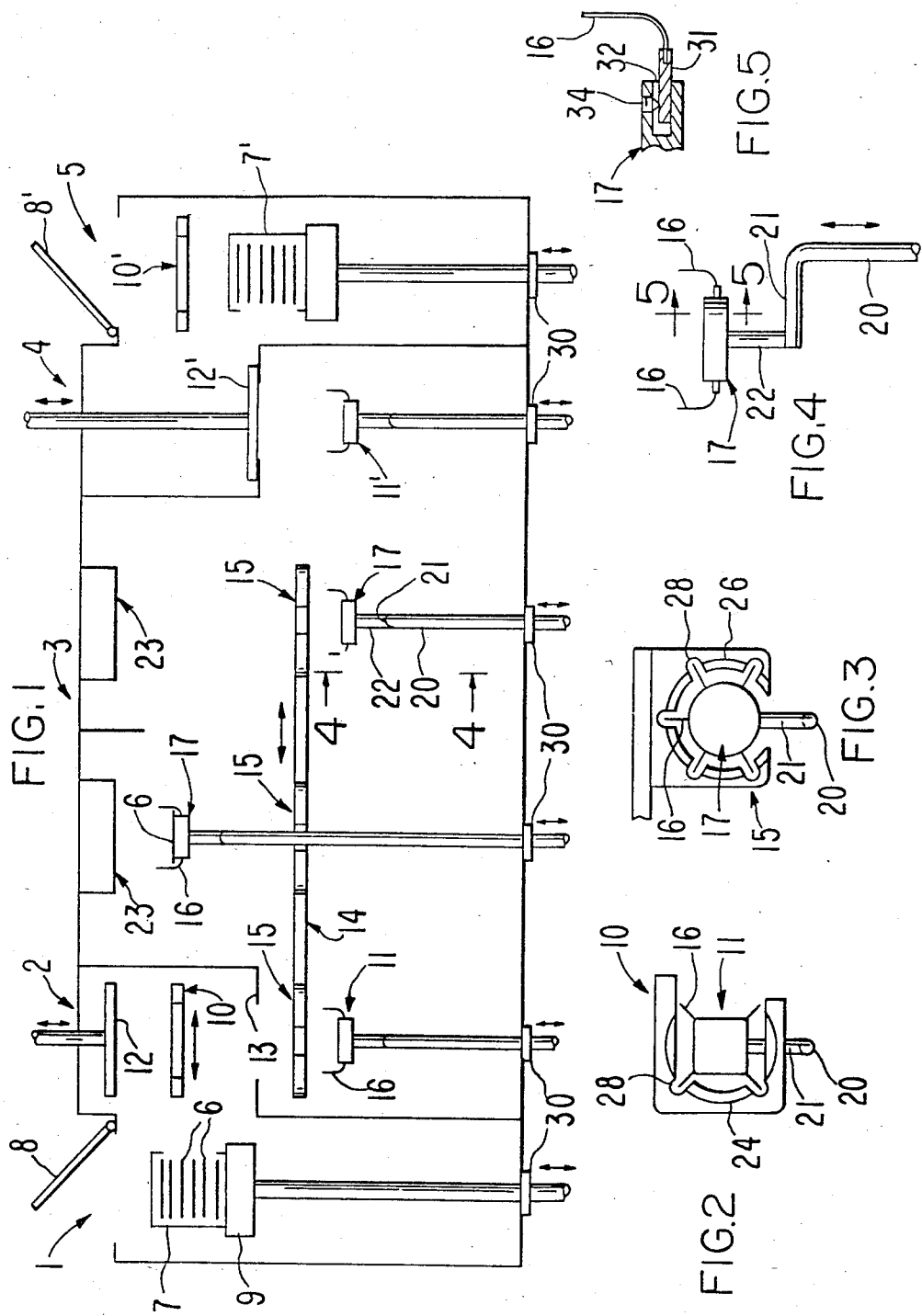

WORKPIECE LIFTING AND HOLDING APPARATUS

This application is a division of application Ser. No. 611,762 filed May 18, 1984 now abandoned.

FIELD OF THE INVENTION

This invention pertains to a workpiece lifting apparatus for removing a workpiece from a delivery shuttle.

BACKGROUND OF THE INVENTION

In the semiconductor industry, systems for transporting wafers between process locations in a sputtering system are well known. Typically circular silicon wafers of various diameters are moved between positions at which metallic coatings are sputtered onto the wafer or at which etching occurs. This process takes place in a vacuum chamber in order to eliminate contamination of the wafer surface. The goal of all such transport systems is to move the wafer from one process location to another.

The transport system within the vacuum chamber can include shuttles to move wafers horizontally and elevators to move wafers vertically. The motion of such shuttles and elevators must be coordinated in order to deliver the wafer from shuttle to elevator or elevator to shuttle. In order to increase the efficiency and volume of output of wafer processing systems, sputtering systems are often designed to process multiple wafers at the same time. Such multiple wafer systems often require moving a shuttle past an internal station where a wafer is being processed without interferring.

Shuttles which pass wafers along a track in a horizontal position are often used with elevators which lift the wafer from the shuttle through a hole in the center of the shuttle. These transport systems have the disadvantage that the shuttle cannot be moved while the elevator is up. Only after the elevator has returned the wafer to the shuttle and withdrawn from the center of the shuttle can the shuttle move.

The objects of this invention then are to describe an elevator and shuttle suitable for lifting a workpiece from a shuttle while permitting the shuttle to move while the elevator is in the up position, to make such an apparatus simple, rugged and inexpensive to manufacture, and to provide firm support for the wafer at all times.

BRIEF SUMMARY OF THE INVENTION

The shuttle wafer carrier is constructed with a hole in the center, as in the prior art. One side of the wafer carrier is opened, thereby forming a throat in the shuttle wafer carrier in the form of the letter C. The elevator has a cantilevered shaft. The pedestal for contacting the wafer is centered under the wafer and the lowest portion of the lifting shaft is under a point outside the shuttle. The connecting portion of the shaft passes through the throat in the wafer carrier as the wafer is lifted. Since the lifting portion of the shaft is outside the shuttle, the shuttle can move with the elevator in the up position. The pedestal for holding the wafer on the elevator is equipped with arms which project upward at an angle to the horizontal, thereby confining the wafer to a pedestal.

The shuttles are moved from the exterior of the chamber by magnetic couplings. The invention includes a first magnet located outside the process chamber and attached by any means which will cause the magnet to be moved horizontally parallel to the wall of the chamber. A second magnet is located inside the process chamber adjacent to the first magnet and in an alignment such that an attraction force exists between the magnets. The second magnet is rigidly fixed to a pair of parallel transport rails which support wafer support arms. Each transport rail is connected by a bearing means to a guide rail which permits the transport rails to move in a horizontal plane in response to movement of the first magnet which causes the second magnet to follow its movement.

These and further constructional and operational characteristics of the invention will be more evident from the detailed description given hereinafter with reference to the figures of the accompanying drawings which illustrate preferred embodiments and alternatives by way of non-limiting examples.

BRIEF DESCRIPTION OF THE DRAWINGS

FIG. 1 is a schematic cross-sectional diagram of a wafer coating system showing the general environment of the invention.

FIG. 2 is a top view of the first shuttle and first elevator.

FIG. 3 is a top view of a wafer carrier on the second shuttle with the second elevator.

FIG. 4 is a side view of the second elevator.

FIG. 5 is a sectional view through the elevator pedestal and projecting arms along the section 5—5 of FIG. 4.

DESCRIPTION OF THE PREFERRED EMBODIMENT

Figure 6:
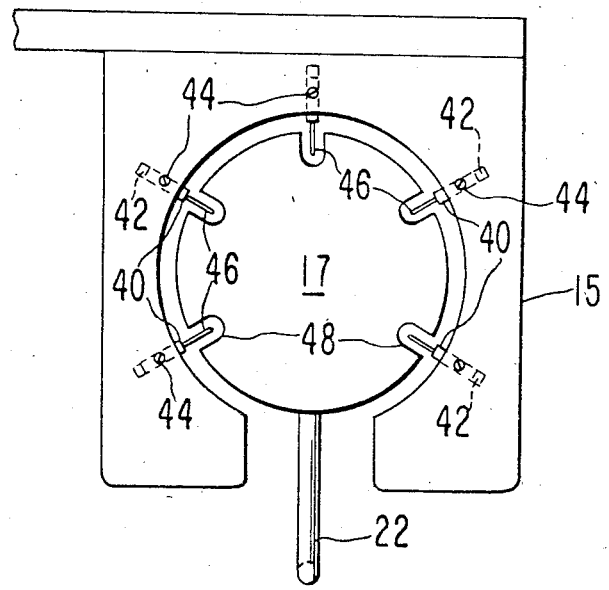
FIG. 6 is a top view of an alternate embodiment of the pedestal.

Referring now to the drawings wherein reference numerals are used to designate parts throughout the various figures thereof, there is shown in FIG. 1 a schematic diagram of the general environment of the invention. The environment shown, for example, is a sputter coating system for coating semiconductor wafers. In FIG. 1 there is shown a loading chamber 1 having an input opening with movable sealing door 8, an inlet or transfer loadlock chamber 2, a processing chamber 3, an outlet loadlock or transfer chamber 4, and an unloading chamber 5 having an output opening with movable sealing door 8.

Although only two processing stations are illustrated in FIG. 1, there can be more than two. For example, it might be advantageous to include RF etching, more than one type of sputtering and annealing in one plating machine.

Semiconductor wafers 6 in a cassette 7 are inserted through a load door 8 to rest on an elevator 9, after which the door is closed. A first horizontally reciprocal shuttle 10 is movable to the left from the position shown in chamber 2 to a position in chamber 1, wherein it is inserted below a given wafer, and elevator 9 is lowered sufficiently to deposit a wafer on first shuttle 10. Then shuttle 10 is moved to the right to the position shown in FIG. 2 at which time an elevator pedestal 11 moves upwardly to lift the wafer above shuttle 10. Next, shuttle 10 moves left again into chamber 1, and then elevator pedestal 11 is lowered downwardly into the bottom left compartment of chamber 3. Next, valve 12 is lowered to form a vacuum seal against annular rim 13. When elevator pedestal 11 moves downwardly, it deposits the wafer on a second shuttle 14 having three or more horizontally spaced projectors 15 or wafer carriers for carrying wafers.

Means, not shown, are provided for moving the shuttles 10 and 14 horizontally back and forth. Any conventional means for imparting the back and forth movement, such as magnetic drive means wherein a magnet mounted outside the chamber is driven back and forth and is magnetically coupled to a magnet on the shuttle so that the shuttle follows the movement of the external magnet. One such drive is shown in copending U.S. patent application No. 381,022 filed May 24, 1982 for "Wafer Transport System", now issued as U.S. Pat. 4,518,078, the disclosures of which are hereby incorporated by reference. It should be understood that the shuttles are mounted on horizontal guide rods on one side wall of their chambers in cantilever fashion so that the opens ends of the projectors 15 face away from the guide rods for free passage of the pedestal supports through such open ends.

The movements of the shuttles are as follows. The shuttle 14 moves to the left in FIG. 1 to receive the wafer 6. The shuttle 14 then moves to the right to the first processing station. The wafer is then taken on the wafer pedestal 17 and raised to the processing position. The shuttle 14 then moves partially back to the left to a "parking" position where the projectors 15 will receive a minimum of plating from the processing station. After processing of the wafer is completed at the first station the shuttle 14 returns completely to the left. The first wafer is then lowered to the second projector 15 from the left while a new wafer is placed on the leftmost projector 15. In the next cycle the first wafer is moved to the second processing station while the second wafer is moved to the first processing station.

FIG. 2 is a top view of shuttle 10 and also shows elevator pedestal 11. The upper end of the elevator pedestal 11 is shown with four projecting arms 16.

FIG. 3 shows one of the wafer carriers 15 on shuttle 14, and an elevator pedestal 17 of slightly different shape than elevator pedestal 11, but again, carrying projecting arms 16.

There must be a minimum of three projecting arms 16 and there may be four, five or more as shown in FIGS. 2 and 3. The projecting arms may be stiff wires or fine rods. Small bars, shims and tubes would also be suitable. In other environments which do not involve high temperatures, plastic, rubber or other materials may be used for the projecting arms.

In order for shuttle 14 to move horizontally when one or more of the elevator pedestals 11 and 17 are elevated, these elevators are driven by an offset arrangement as shown in FIG. 4, taken, for example, on line 4—4 through the right-hand elevator in FIG. 1. Thus, there is a lifting rod 20, an offset or horizontal rod 21 and a vertical rod 22. Other shapes than rods can be used. The rods 20, 21 and 22 can be attached at right angles as shown in FIG. 4 or at angles which deviate slightly from a right angle. It is considered equivalent to use one cantilevered, s-shaped or dog-leg rod as shown in FIG. 4 in place of the 3 rods 20, 21 or 22 together as described. The lifting rod 20 passes through a sealing means 30 to an actuator. The actuator may be pneumatic or electrical. In the preferred embodiment, the elevators of the loading and unloading chambers are actuated by electrical stepping motors to provide incremental vertical steps. The sealing means 30 may be O-rings, bellows or other such devices.

The shuttle 10 and carrier 15 can be formed with recesses 24 and 26 which confine the wafer horizontally. Inlets 28 in the pedestals 11 and 17 provide means to pass the projecting arms through the pedestal while providing support for the wafer.

The projecting arms 16 are joined to the elevator pedestals 11 and 17 at approximately equal spacing. As shown in FIG. 5, the projecting arms are mounted in locating pins 31. The locating pins are set into sockets 32 and held by set screws 34, thereby allowing the projecting arms to be adjusted in position for proper clearance from the wafer. The pedestals 11 or 17 can also be eliminated and the projecting arms 16 attached directly to the vertical rod 22. In another alternate embodiment the projecting arms 16 can be eliminated and the wafer taken directly on the wafer pedestals 11 or 17.

Figure 7:
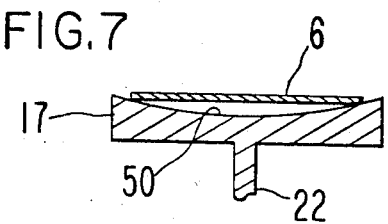
FIG. 7 is a sectional view of the alternate embodiment of FIG. 6.
Figure 8:
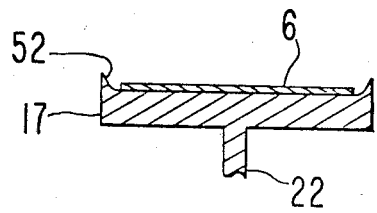
FIG. 8 is an alternate sectional view of the embodiment of FIG. 6.

In another embodiment shown in FIGS. 6–8 particularly suitable for RF etching, the pedestal can be made larger than the wafer to insure electrical contact along the edge of the wafer. Thus the opening in the projector 15 would be made larger. The projector rather than the pedestal would now carry at least three projecting arms 46, set into locating pins 40. The projectors have holes 42 into which the locating pins 40 are held with set screws 44. The pedestal 17 has a depression 50, or a lip 52 to hold the wafer. The pedestal 17 has inlets 48 to allow clearance of the projecting arms 46.

Vacuum pumping means are provided to pump separately the loading chamber 1, the processing chamber 3 and the unloading chamber 5.

The invention thus described permits movement of the shuttle while the elevator is in an up position, provides firm support for the wafers with minimum contact and is rugged, simple and inexpensive to manufacture.

This invention is not limited to the preferred embodiments heretofore described, to which variations and improvements may be made, consisting of mechanically and electrically equivalent modifications to component parts, without leaving the scope of protection of the present patent, the characteristics of which are summarized in the following claims.

What is claimed is:

1. An apparatus for processing workpieces, said apparatus comprising:
   wall means forming a loading chamber, an inlet loadlock chamber, a processing chamber, an outlet loadlock chamber, and an unloading chamber, all said chambers being adjacent one another in the order named;
   an elevator in each of said loading and unloading chambers for supporting cassettes, said cassettes being adapted to carry workpieces in horizontal orientation spaced one above the other, and means for moving said elevators in incremental vertical steps;
   said loading and unloading chambers each having an opening for inserting and removing cassettes, and movable sealing doors for opening and closing said openings;
   said loadlock chambers each having a vertical opening interconnecting the loadlock chambers with their adjacent loading and unloading chambers;

said loadlock chambers each having wall means forming a horizontal opening into said processing chamber for transferring workpieces between said loadlock chambers and said processing chamber;

said inlet loadlock chamber having a workpiece-holding inlet shuttle movable horizontally from said inlet loadlock chamber into said loading chamber to remove workpieces one at a time from a cassette in said loading chamber and transfer such workpiece into said inlet loadlock chamber to a position aligned above the horizontal opening in said inlet loadlock chamber;

said outlet loadlock chamber having a workpiece-holding outlet shuttle movable horizontally from said outlet loadlock chamber into said unloading chamber to insert workpieces one at a time into a cassette in said unloading chamber, said outlet shuttle having a stationary position in said outlet loadlock chamber, said stationary position being aligned above the horizontal opening in said outlet loadlock chamber;

a workpiece-holding process shuttle in said processing chamber for holding at least three workpieces and adapted for horizontal back and forth movement below said horizontal openings, said shuttle including at least three openings therethrough, each said opening including a side portion extending to and through an edge of said shuttle;

said processing chamber having an inlet transfer elevator aligned with the horizontal opening in said inlet loadlock chamber, and an outlet transfer elevator aligned with the horizontal opening in said outlet loadlock chamber for transferring workpieces between said process shuttle and said inlet and outlet shuttles, respectively;

at least one workpiece-processing means mounted above said process shuttle for processing a workpiece; and at least one process elevator in said processing chamber aligned with said at least one processing means for removing a workpiece from said process shuttle to an elevated position for processing and then back to said process shuttle;

said process elevator being dimensioned to fit through said openings in said shuttle whereby said elevator will pass through said opening to permit movement of said shuttle while said process elevator is in a raised position.

2. An apparatus for processing workpieces as in claim 1 wherein said wall means forming said horizontal openings provides a circular sealing surface around the periphery of each of said horizontal openings, a disc valve in each of said inlet and outlet loadlock chambers, means for vertically moving each of said disc valves from a position above its inlet or outlet shuttle, respectively, to a position in sealing engagement with its respective one of said circular sealing surfaces, whereby when said inlet and outlet shuttles are out of their respective inlet and outlet loadlock chambers, the respective disc valve can be closed against its respective sealing surface.

3. An apparatus for processing workpieces, said apparatus comprising:

a processing chamber, and supplemental chamber means having an opening into said processing chamber;

a workpiece carrier in said processing chamber;

means for conveying a workpiece from said supplemental chamber means to said workpiece carrier;

said workpiece carrier including an opening therethrough and having workpiece carrying means adjacent said opening and adapted to releasably carry a workpiece in alignment with said opening, said opening including a side portion extending to and through an edge of said carrier;

a support structure, support means connected to said support structure and adapted to releasably support a workpiece adjacent an end portion of the support structure;

means for reciprocating said support structure such that said support means on the support structure moves along a first path of travel;

said workpiece carrier being adapted for movement along a second path of travel transverse to said first path of travel to move said carrier between spaced positions, including one position in which said support means on said support structure is aligned with said opening in the carrier;

said support means on the support structure being dimensioned to fit through said opening, whereby when said support means is moved along said first path of travel, said support means will pass through said opening when the carrier is stationed in said one position;

said support structure having an offset portion spaced outwardly from said first path of travel, said offset portion being configured such that when said support means on the support structure is moved through said aperture to move a workpiece from said carrier to a position spaced from the carrier, said offset portion is spaced outwardly of said edge of the carrier, whereby when a workpiece is thus positioned on said support means, said carrier is free to move away from said one position without contacting said support structure.

4. An apparatus for processing workpieces as in claim 3 wherein said supplemental chamber means includes a loading chamber, and said loading chamber contains means for supporting and conveying a cassette of workpieces.

5. An apparatus for processing workpieces as in claim 4 wherein said supplemental chamber means further includes a load lock means between said loading chamber and said processing chamber.

6. An apparatus for processing workpieces as in claim 3 wherein said workpiece carrier has more than one said opening therethrough, and one said workpiece conveying means is provided adjacent each of said openings, there are more than one said support structures, and one said support means is connected to each support structure, and each said support structure has said offset portion, one of said support means being aligned with said opening between said supplemental chamber means and said processing chamber, another of said support means being spaced from said one support means along said path of travel of the workpiece carrier, and the positioning of said openings and said support means is such that when said workpiece carrier is in said one position one of said openings is aligned with one of said support means and another of said openings is aligned with another of said support means.

7. An apparatus for processing workpieces, said apparatus comprising:

wall means forming a loading chamber, a processing chamber having a plurality of processing stations therein, and an unloading chamber;

a shuttle workpiece carrier in said processing chamber;

means for conveying a workpiece in said loading chamber to said shuttle workpiece carrier;

an elevator at each processing station including an elevator pedestal, an elongated lifting support member, means for offsetting said pedestal from said lifting support member, and means for actuating said support member;

a shuttle workpiece carrier having central opening and throat open to one side, with said carrier oriented so that said means for offsetting said pedestal can pass through said throat as the workpiece is raised;

means for moving said shuttle workpiece carrier; and means for conveying a workpiece from said shuttle workpiece carrier into said unloading chamber.

8. An apparatus for processing workpieces as in claim 7 including at least three projecting arms attached to said pedestal, said projecting arms being approximately equally spaced and attached at an angle to the horizontal so as to horizontally confine the workpiece.

9. An apparatus for processing workpieces as in claim 8 wherein said central opening in said shuttle workpiece carrier has inlets in said opening for the passage of said projecting arms through said shuttle as the workpiece is raised.

10. An apparatus for processing workpieces as in claim 7 including at least three projecting arms attached to said shuttle workpiece carrier, said projecting arms being approximately equally spaced and attached horizontally so as to support the workpiece.

11. An apparatus for processing workpieces as in claim 10 wherein said pedestal has inlets on its periphery for the passage of said projecting arms as the workpiece is raised.

12. An apparatus for processing workpieces as in claim 7 wherein said shuttle workpiece carrier has recesses which confine the workpiece horizontally.

13. An apparatus for processing workpieces as in claim 7 wherein said means for conveying a workpiece in each of said loading and unloading chambers includes an elevator for supporting and conveying a cassette of workpieces in horizontal orientation spaced one above the other.

14. An apparatus for processing workpieces as in claim 13 including a load lock means between said loading chamber and said processing chamber and between said processing chamber and said loading chamber.

* * * * *